(12) United States Patent
Vezier et al.

(10) Patent No.: US 9,391,621 B2
(45) Date of Patent: Jul. 12, 2016

(54) CONFIGURABLE MULTIPLY-ACCUMULATE

(71) Applicant: Scaleo Chip, Valbonne, Sophia Antipolis (FR)

(72) Inventors: Loic Vezier, La Roquette sur Siagne (FR); Farid Tahiri, Le Cannet (FR)

(73) Assignee: Silicon Mobility, Valbonne, Sophia Antipolis (FR)

( * ) Notice: Subject to any disclaimer, the term of this patent is extended or adjusted under 35 U.S.C. 154(b) by 103 days.

(21) Appl. No.: 14/102,300

(22) Filed: Dec. 10, 2013

(65) Prior Publication Data

US 2015/0095388 A1    Apr. 2, 2015

Related U.S. Application Data

(60) Provisional application No. 61/883,458, filed on Sep. 27, 2013.

(51) Int. Cl.
*G06F 7/38* (2006.01)
*H03K 19/177* (2006.01)
*G06F 7/544* (2006.01)

(52) U.S. Cl.
CPC ........ *H03K 19/17732* (2013.01); *G06F 7/5443* (2013.01)

(58) Field of Classification Search
CPC ............................ G06F 7/00; H03K 19/17732
USPC .................................................. 708/523–524
See application file for complete search history.

(56) References Cited

U.S. PATENT DOCUMENTS

| | | | |
|---|---|---|---|
| 5,991,785 A * | 11/1999 | Alidina | G06F 7/544 708/207 |
| 6,538,470 B1 | 3/2003 | Langhammer et al. | |
| 6,708,191 B2 | 3/2004 | Chapman et al. | |
| 6,771,094 B1 | 8/2004 | Langhammer et al. | |
| 7,873,815 B2 | 1/2011 | Sih et al. | |
| 7,890,566 B1 * | 2/2011 | Zbiciak | G06F 9/30014 708/523 |
| 7,970,979 B1 | 6/2011 | Verma et al. | |
| 8,010,590 B1 | 8/2011 | Taylor | |
| 8,024,394 B2 | 9/2011 | Prokopenko et al. | |
| 8,117,247 B1 | 2/2012 | Taylor | |
| 8,131,909 B1 | 3/2012 | Verma et al. | |
| 8,438,208 B2 * | 5/2013 | Olson | G06F 7/4876 708/490 |
| 2005/0171990 A1 | 8/2005 | Bishop et al. | |
| 2005/0198472 A1 * | 9/2005 | Sih | G06F 9/30014 712/218 |
| 2006/0230096 A1 | 10/2006 | Thendean et al. | |
| 2007/0067380 A2 | 3/2007 | Bishop et al. | |
| 2007/0185953 A1 * | 8/2007 | Prokopenko | G06F 7/483 708/523 |
| 2008/0243976 A1 | 10/2008 | Wiencke | |
| 2010/0011047 A1 | 1/2010 | Jackson | |
| 2011/0161389 A1 * | 6/2011 | Langhammer | G06F 7/52 708/209 |

* cited by examiner

Primary Examiner — Tan V. Mai
(74) Attorney, Agent, or Firm — Blakely Sokoloff Taylor & Zafman LLP

(57) ABSTRACT

Field programmable gate arrays (FPGA) contain, in addition to random logic, also other components, such as processing units, multiply-accumulate (MAC) units, analog circuits, and other elements, configurable with respect of the random logic, to enhance the capabilities of the FPGA. A circuit for a filed configurable MAC unit is provided to allow various configurations of ADD, SUBTRACT, MULTIPLY and SHIFT functions. Optionally, registered input and registered output support a multi-cycle path. A configuration of a constant facilitates the configuration of the circuit to perform infinite impulse response (IIR) and finite impulse response (FIR) functions in hardware.

5 Claims, 2 Drawing Sheets

200

|            | output         | 0                | 1               |
|------------|----------------|------------------|-----------------|
| cfg[23:0]  | 24 bit cst     | n/a              |                 |
| cfg[24]    | multiple       | unsigned         | signed          |
| cfg[25]    | mux_a          | reg_a            | a               |
| cfg[26]    | mux_b          | reg_b            | a               |
| cfg[27]    | b_or_cst       | cst              | mux_b           |
| cfg[28]    | b_or_r         | ext_b48          | reg_r           |
| cfg[29]    | addsub         | subtraction      | addition        |
| cfg[30]    | ab_or_r        | ab_shifted       | addsub          |
| cfg[31]    | r, eq,cout, ...| reg_r,reg_flags  | ab_or_r,flags   |
| cfg[34:32] | ab_shifted     | shifted values: see table | |

| a_hold  | nxt_a          | a              | reg_a          |
|---------|----------------|----------------|----------------|
| b_hold  | nxt_b          | b              | reg_b          |
| r_hold  | nxt_r,nxt_flg  | ab_or_b,flg    | reg_r,reg_flg  |
| clear_r | reg_r, r_flags | nothing        | Reset r, flags |

FIGURE 2

CONFIGURABLE MULTIPLY-ACCUMULATE

CROSS-REFERENCE TO RELATED APPLICATIONS

This application claims the benefit of U.S. Provisional Patent Application No. 61/883,458 filed Sep. 27, 2013.

BACKGROUND OF THE INVENTION

1. Field of the Invention

The invention generally relates to configurable multiply-accumulate/subtract circuits and more particularly to such circuits in a field programmable gate array (FPGA) and embedded FPGA (EFPGA).

2. Prior Art

In today's world the use of integrated circuits (ICs) is ubiquitous, and they can be found in practically every device, even in the regular household. A particular branch of ICs is that of field programmable gate arrays (FPGAs) which are designed to be configured in the field, using some kind of a hardware description language (HDL). The language describes the specific configuration of components of the FPGA so that it is operated as desired by a user making use of the IC. One of the main advantages of FPGAs is the ability to perform partial or full reconfiguration of the device even when it is already connected as part of a system, if such capabilities are kept enabled for the device. In certain cases, reconfiguration takes place as part of the normal operation of the device as it may be necessary to perform different functions at different times.

In some cases FPGAs have therein embedded components such as microprocessors, and other peripheral devices to provide enhanced functionality. This integration leads lower costs and reduced failures of the system. In other cases, certain ICs integrate therein features of FPGAs, creating embedded FPGAs (EFPGAs) to allow a certain degree of flexibility to a user to customize a component in a way that fits specific user design needs. A particularly important circuit used in certain application is known as a multiply-accumulate (MAC) where the circuit is defined to perform a summation of the result of a multiplication repeatedly. Such circuits have been commonly added into modern FPGA and EFPGA. In some cases there is a need to deviate from the standard MAC operation to perform the likes of multiply-subtract or even include a shift function. Such capabilities not being available today in a configurable manner yield such circuits deficient with respect to the growing demand for such functionality and the performance advantages they provide.

Therefore, in view of the deficiencies of the prior art it would be advantageous to provide a solution for a configurable multiply-accumulate circuitry that will be capable of addressing the deficiencies of the prior art.

BRIEF DESCRIPTION OF THE DRAWINGS

The subject matter that is regarded as the invention is particularly pointed out and distinctly claimed in the claims at the conclusion of the specification. The foregoing and other objects, features and advantages of the invention will be apparent from the following detailed description taken in conjunction with the accompanying drawings.

FIG. 2 is a configuration table for a CMAC according to an embodiment.

DETAILED DESCRIPTION OF THE PREFERRED EMBODIMENTS

Figure 1:
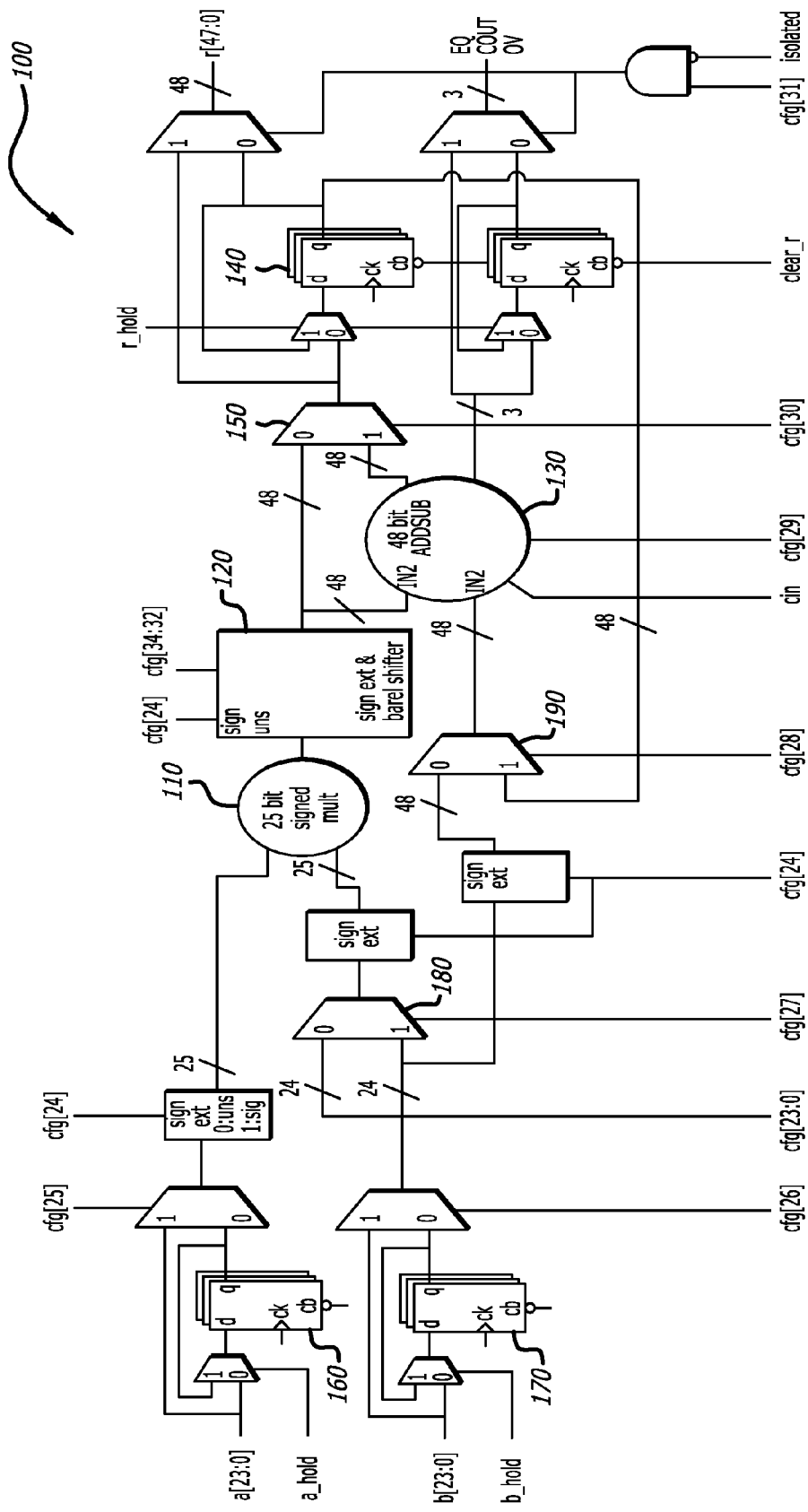
FIG. 1 is a block diagram of a configurable multiply-accumulate (CMAC) according to an embodiment.

It is important to note that the embodiments disclosed by the invention are only examples of the many advantageous uses of the innovative teachings herein. In general, statements made in the specification of the present application do not necessarily limit any of the various claims. Moreover, some statements may apply to some inventive features but not to others. In general, unless otherwise indicated, singular elements may be in plural and vice versa with no loss of generality. In the drawings, like numerals refer to like parts through several views.

Field programmable gate arrays (FPGA) contain, in addition to random logic, also other components, such as processing units, multiply-accumulate (MAC) units, analog circuits, and other elements, configurable with respect of the random logic, to enhance the capabilities of the FPGA. A circuit for a field configurable MAC unit is provided to allow various configurations of ADD, SUBTRACT, MULTIPLY and SHIFT functions. Optionally, registered input and registered output support a multi-cycle path. A configuration of a constant facilitates the configuration of the circuit to perform infinite impulse response (IIR) and finite impulse response (FIR) functions in hardware.

Reference is now made to FIG. 1 that depicts an exemplary and non-limiting block diagram of a configurable multiply-accumulate (CMAC) 100 according to an embodiment. The basic components for the circuit comprise a signed multiplier 110 that is configured to receive two operands, 'a' and 'b' and perform a multiplication there between. The output of the multiplier 110 is provided to a sign extender and barrel shifter unit 120 that can perform a shift function on the result provided by the multiplier 110. The output of unit 120 is provided to an add/subtract unit 130 that can add the result from the current cycle to a previously stored result fed back from the output of register 140. A plurality of configuration bits configure the computational path in a manner that allows a desired operation. For example, configuration bit cfg[30] controls a multiplexer 150 that selects between the output of unit 120 to be fed directly to register 140, or, alternatively to select the output of the add/subtract unit 130. In another example, configuration bit cfg[28] selects the input to the add/subtract unit 130 from a fed back previous result or to a value provided as an input value. In yet another example, configuration bit cfg[27] selects between an input operand 'b' and a constant provided, for example for the facilitation of infinite impulse response (IIR) and finite impulse response (FIR) functions by the CMAC 100. While FIG. 1 specifically shows bit ranges for the CMAC 100 this should not be viewed limiting upon the invention and other bit ranges may be appropriately selected by those of ordinary skill in the art.

Accordingly, the CMAC 100 may be configured to perform the following functions:

$$R=OP1\text{<addsub>}((OP2\text{<mult>}OP3)\text{<Xshifter>})$$

In the case shown in FIG. 1, OP1 (not shown on FIG. 1) is a 48-bit value r[47:0] output value; OP2 (not shown on FIG. 1) is a 24-bit input value, which may be registered in register 160 or directly transferred for operation; and OP3 (not shown on FIG. 1) is a 24-bit input value, which may be registered in register 170 or directly transferred for operation. The <addsub> operation may be selected under the control of a configuration bit, for example cfg[29], to perform either an addition or a subtraction respective of the configuration bit. The <Xshifter> operation performs various predefined shifting functions that can be multiplications, for example but not by way of limitation, multiply by 1 or by 2, etc. and divisions, for example but not by way of limitation, divide by 16, 64, 256 etc. That is, predefined scaling of values output can be achieved. A first multiplexer 180 is configured to provide the multiplier 110 under the control of the configuration input, for example input cfg[34:0], one of a constant, provided on cfg [23:0] or the input operand b[23:0]. A second multiplexer 190 is configured to provide to the add/subtract unit 130 one of the input operand b[23:0] or the output of the register 140 as a feedback of the output of the CMAC 100.

FIG. 2 is an exemplary and non-limiting configuration table 200 for a CMAC 100 according to an embodiment. In this exemplary case, the configuration word comprises of 35-bits, however this should not be viewed as a limitation of the invention and used merely for description purposes. One of ordinary skill in the art would readily be able to adapt the bit range of the configuration word to suit specific needs of the CMAC 100 without departing from the scope of the invention. Specific to this example, 24-bit, cfg[23:0] provide a constant value to be used in the likes of IIR and FIR computations. The configuration bit cfg[24] is used to indicate signed and unsigned operation of the result of the multiplier 110, configuring the sign extender and shifter 120 accordingly. Configuration bits cfg[25] and cfg[26] control multiplexers at the output of registers 160 and 170 respectively, to select desired values to be forwarded to the multiplier 110. Configuration bit [cfg[27] is used to select between OP2 as an input and a constant value provided on cfg[23:0]. Configuration bit cfg[28], allows selection between a value fed back from the output of CMAC 100, specifically register 140, or a value that is either a constant or OP2 depending on the selection made by cfg[27] value. Configuration bit cfg[29] configures the add/subtract unit 130 to be in either a subtraction or addition mode. Configuration bit cfg[30] determines which result will be fed to the output, the output of the shifter 120 or the multiplier 130. Configuration bit cfg[31] determines which result will be outputted as an output r[47:0] of the CMAC and corresponding flags. Configuration bits cfg[34:32] providing the scaling values for the shifter, to multiply or divide depending on the shift direction and corresponding to the value provided on these configuration bits, and as further explained herein. Hold signal, a_hold, b_hold and r_hold, determine if a new value or a previous value should be outputted from their respective registers, for example registers 160, 170 and 140. Typically, the configuration values are stored in a register (not shown) at time of configuration of the CMAC 100.

All examples and conditional language recited herein are intended for pedagogical purposes to aid the reader in understanding the principles of the invention and the concepts contributed by the inventor to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure. One of ordinary skill in the art would readily appreciate the advantages of the use of the CMAC 100 architecture in various integrated circuits (ICs) and in particular as configurable elements of FPGA and EFPGA, providing them with extended capabilities.

What is claimed is:

1. A configurable multiply-accumulate (CMAC) unit comprising:
   an interface to receive a configuration word containing a plurality of values;
   a multiplier (110) configured to receive a first value and a second value and provide a multiplication result respective thereto;
   a configurable sign extender and shifter (120) connected to the multiplier (110) to receive the multiplication result, the configurable sign extender and shifter operative under the control of one or more values provided by the configuration word, to: configure the configurable sign extender and shifter (120) to operate with respect of signed and unsigned values; and, determine a scaling of the multiplication result;
   a configurable add/subtract unit (130) connected to the configurable sign extender and shifter (120) to receive a result value from the configurable sign extender and shifter (120) and further configured to receive a third value, the configurable add/subtract unit operative under the control of one or more values provided by the configuration word, to: perform an addition between the result value from the configurable sign extender and shifter (120) and the third value; or, perform a subtraction between the result value from the configurable sign extender and shifter (120) and the third value;
   a first multiplexer (180) configured to receive the first value and a constant value and further coupled to at least the multiplier, the first multiplexer operative under the control of one or more values provided by the configuration word, to: provide the first value to at least the multiplier (110); or, provide the constant value to at least the multiplier (110); and
   a second multiplexer (190) configured to receive one of the first value or hold value of the first value, and a fourth value from an output register (140) of the CMAC, the second multiplexer (190) operative under the control of one or more values provided by the configuration word, to: provide either one of the first value or the constant as the third value to the add/subtract unit; or, provide the fourth value as the third value to the add/subtract unit.

2. The configurable multiply-accumulate (CMAC) unit of claim 1 further comprised of:
   a third multiplexer (150) coupled to receive an output of the configurable sign extender and shifter (120) and an output of the configurable add/subtract unit (130) and to: provide either the output of the configurable sign extender and shifter (120) or the output of the configurable add/subtract unit to the output register (140).

3. The configurable multiply-accumulate (CMAC) unit of claim 1 further comprised of:
   additional registers and multiplexers, whereby;
   the first value may be a first input provided to the configurable multiply-accumulate (CMAC) unit or a registered first value of the first input; and
   the second value may be a second input provided to the configurable multiply-accumulate (CMAC) unit or a registered second value of the second input.

4. An integrated circuit (IC) having embedded therein the configurable multiply-accumulate CMAC unit of claim 1.

5. The IC of claim 4, wherein the IC is one of: field programmable gate array (FPGA), or embedded FPGA (EFPGA).

* * * * *